(12) United States Patent
Ausserlechner

(10) Patent No.: US 11,205,748 B2
(45) Date of Patent: Dec. 21, 2021

(54) 3-CONTACT VERTICAL HALL SENSOR ELEMENTS CONNECTED IN A RING AND RELATED DEVICES, SYSTEMS, AND METHODS

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/586,950

(22) Filed: May 4, 2017

(65) Prior Publication Data
US 2017/0236996 A1 Aug. 17, 2017

Related U.S. Application Data

(63) Continuation of application No. 14/505,859, filed on Oct. 3, 2014, now Pat. No. 9,671,474.

(51) Int. Cl.
*H01L 43/04* (2006.01)
*G01R 33/07* (2006.01)
(Continued)

(52) U.S. Cl.
CPC ............ *H01L 43/04* (2013.01); *G01R 33/075* (2013.01); *G01R 33/077* (2013.01); *H01L 27/22* (2013.01); *H01L 43/065* (2013.01); *H01L 43/14* (2013.01)

(58) Field of Classification Search
CPC ..... G01R 33/075; G01R 33/077; H01L 27/22; H01L 43/04; H01L 43/065; H01L 43/14
(Continued)

(56) References Cited

U.S. PATENT DOCUMENTS 9,349,943 B2 * 5/2016 Rohrer ................. H01L 43/065
2007/0290682 A1 12/2007 Oohira et al.
(Continued)

FOREIGN PATENT DOCUMENTS

DE 10150950 C1 6/2003
DE 102011107767 A1 1/2013
(Continued)

OTHER PUBLICATIONS

Heidari, et al., "Analysis and Modeling of Four-Folded Vertical Hall Devices in Current Doman", IEEE, 4 pages, © 2014.
(Continued)

*Primary Examiner* — Jay Patidar
(74) *Attorney, Agent, or Firm* — Schiff Hardin LLP

(57) ABSTRACT

A vertical Hall effect sensor having three Hall effect regions interconnected in a ring can be operated in a spinning scheme. Each Hall effect region has three contacts: the first Hall effect region includes first, second, and third contacts; the second Hall effect region has fourth, fifth, and sixth contacts, and the third Hall effect region has seventh, eighth, and ninth contacts. Interconnections between the Hall effect regions are provided such that a first terminal is connected to a third contact, a second interconnection is arranged between the second and fourth contacts, a third terminal is connected to the sixth contact, a fourth interconnection is arranged between the fifth and seventh contacts, a fifth terminal is connected to the ninth contact, and a sixth interconnection is arranged between the first and eighth contacts.

26 Claims, 12 Drawing Sheets

(51) Int. Cl.
*H01L 43/06* (2006.01)
*H01L 43/14* (2006.01)
*H01L 27/22* (2006.01)

(58) Field of Classification Search
USPC .......................................................... 324/252
See application file for complete search history.

(56) References Cited

U.S. PATENT DOCUMENTS

| | | | |
|---|---|---|---|
| 2009/0256559 A1* | 10/2009 | Ausserlechner | G01R 33/07 324/251 |
| 2010/0042336 A1 | 2/2010 | Lee et al. | |
| 2011/0050210 A1* | 3/2011 | Schrems | H01L 43/065 324/207.2 |
| 2012/0016614 A1* | 1/2012 | Hohe | G01R 33/0017 702/85 |
| 2013/0015853 A1 | 1/2013 | Raz et al. | |
| 2013/0127453 A1 | 5/2013 | Ausserlechner | |
| 2014/0210461 A1 | 7/2014 | Ausserlechner | |
| 2014/0327435 A1 | 11/2014 | Rohrer | |
| 2015/0115950 A1* | 4/2015 | Cornils | G01R 33/07 324/251 |
| 2015/0323613 A1* | 11/2015 | Ausserlechner | H01L 27/22 324/251 |
| 2015/0331068 A1* | 11/2015 | Vecchi | G01R 33/07 324/251 |
| 2015/0369881 A1 | 12/2015 | Ausserlechner et al. | |
| 2016/0011281 A1* | 1/2016 | Sander | G01R 33/077 324/207.2 |

FOREIGN PATENT DOCUMENTS

| | | | | |
|---|---|---|---|---|
| DE | 102012221009 A1 | 5/2013 | | |
| DE | 102012212594 A1 | 11/2013 | | |
| DE | 202014004425 U1 * | 9/2014 | ............. | G01D 5/145 |
| EP | 2546670 A2 * | 1/2013 | ............. | G01R 33/07 |
| JP | 58154263 | 9/1983 | | |

OTHER PUBLICATIONS

Office Action dated Oct. 10, 2017 for German Patent Application No. 102015219002.1.

* cited by examiner

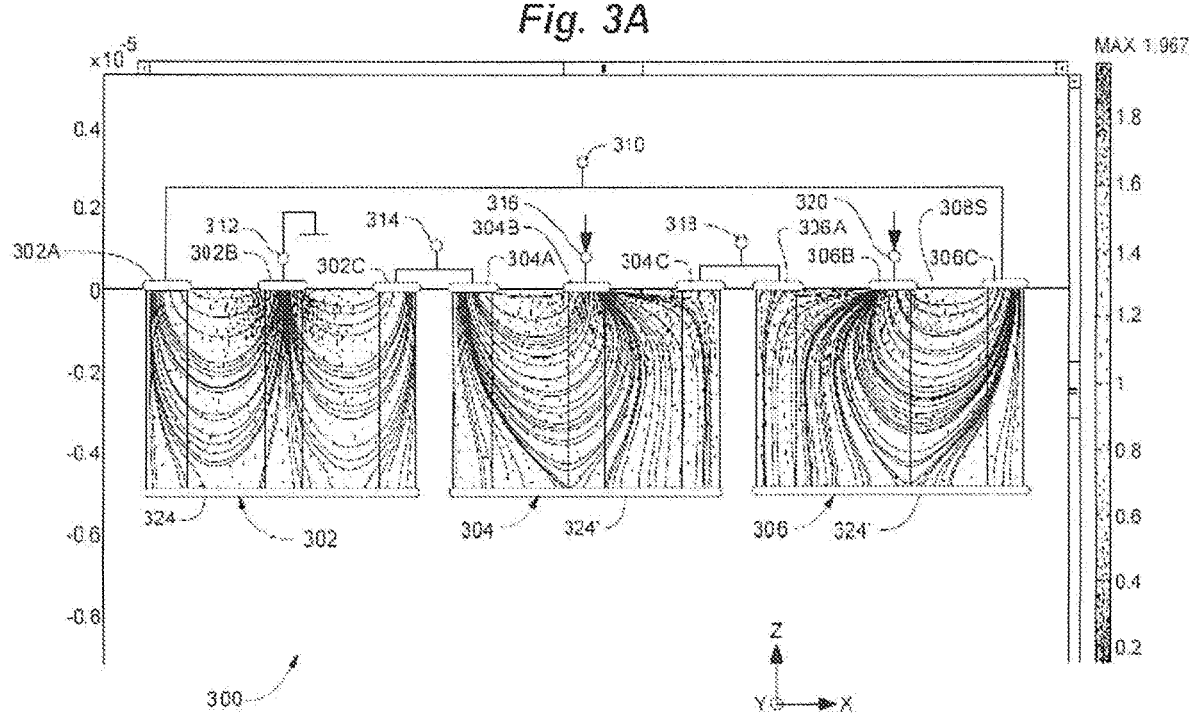

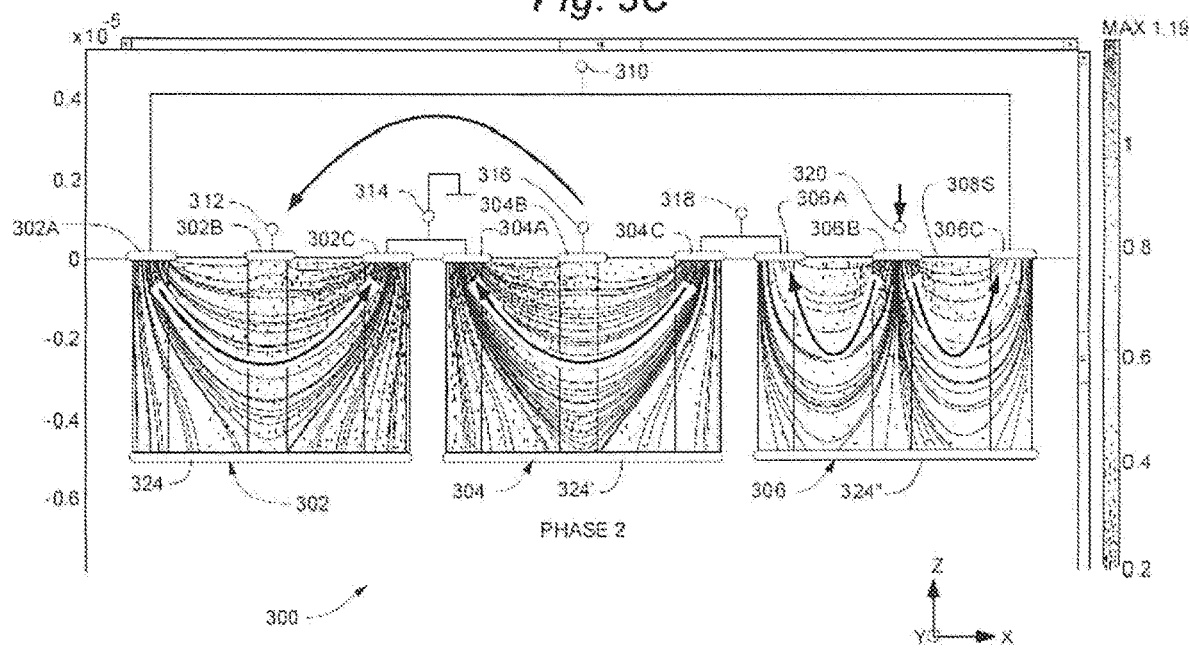

3-CONTACT VERTICAL HALL SENSOR ELEMENTS CONNECTED IN A RING AND RELATED DEVICES, SYSTEMS, AND METHODS

TECHNICAL FIELD

Embodiments relate to magnetic field sensors. More particularly, embodiments relate to arrangements and configurations of vertical Hall effect sensors.

BACKGROUND

Hall effect sensors and structures are used in a variety of systems to measure magnetic field. Hall effect structures make use of the Hall effect, whereby a voltage is generated across a conductor or semiconductor due to Lorentz forces on moving charge carriers. This voltage, called the Hall voltage, can be measured to ascertain the strength of the applied magnetic field. The Hall voltage is inversely proportional to the density of charge carriers. Accordingly, Hall effect structures and sensors are often made of a semiconducting material with relatively lower charge carrier density than typical conductors.

Hall effect sensors can be either vertically or horizontally oriented in a semiconductor die. Vertical Hall effect structures respond to a magnetic field component parallel to the main surface of a die in which they are positioned, and into which they extend.

Four-contact and three-contact Hall devices are known in the art. In a four-contact device, electrical supply terminals are connected to a first contact and a second contact (referred to as supply contacts) that can be positioned along a primary axis in some systems. Third and fourth contacts (referred to as output contacts) are positioned to measure the voltage generated by the current flow. The output contacts can be positioned along the secondary axis in some systems. In a three-contact Hall device, two contacts can be used for electrical supply and a third can be used to measure signal. For example, two supply contacts can be used to provide a current input, and an output voltage can be measured at the third contact (the output contact). Alternatively, all of the contacts can be used as supply contacts, and the output voltage can be measured between two of the contacts. In yet another operating phase, first and second supply contacts can provide voltage input, and the output voltage can be measured between two output contacts.

Permutation of the supply and output contacts is referred to as spinning. During spinning, equal current or voltage is provided to the system in all operating phases. Vertical Hall devices often have different internal resistance in various operating phases, and so the input voltage is different in each phase. This is a disadvantage, because voltage "headroom" must be provided in the circuit (i.e., the circuit must be capable of providing sufficient current or voltage supply across every Hall device in every operating phase that is sufficient to pass through the Hall device having the largest resistance) and power can be unnecessarily and inhomogeneously dissipated in a system having unequal resistance in the various operating phases. This can lead to increased offset or zero-point errors due to temperature gradients between the output contacts of the vertical Hall devices and associated thermal electromotive force.

SUMMARY

Embodiments relate to a vertical Hall effect sensor comprising a first Hall effect region having first, second, and third contacts arranged along a surface of a die, a second Hall effect region having fourth, fifth, and sixth contacts arranged along a surface of a die, a third Hall effect region having seventh, eighth, and ninth contacts arranged along a surface of a die. The first, second, and third Hall effect region are electrically isolated against each other. Interconnections external to the Hall effect regions include: a first interconnection comprising a first terminal connected to the third contact, a second interconnection between the second and fourth contacts; a third interconnection comprising a third terminal connected to the sixth contact; a fourth interconnection between the fifth and seventh contacts; a fifth interconnection comprising a fifth terminal connected to the ninth contact; and a sixth interconnection between the first and eighth contacts.

According to another embodiment, a method comprises providing a first Hall effect region having first, second, and third contacts arranged along a surface; providing a second Hall effect region having fourth, fifth, and sixth contacts arranged along the surface; providing a third Hall effect region having seventh, eighth, and ninth contacts arranged along the surface; and interconnecting the first, second, and third Hall effect regions such that a first terminal is permanently connected to the third contact, a second terminal is permanently connected to the second and fourth contacts, a third terminal is permanently connected to the sixth contact, a fourth terminal is permanently connected to the fifth and seventh contacts, a fifth terminal is permanently connected to the ninth contact, and a sixth terminal is permanently connected to the first and eighth contacts.

BRIEF DESCRIPTION OF THE DRAWINGS

Embodiments may be more completely understood in consideration of the following detailed description in connection with the accompanying drawings, in which:

FIGS. 3A-3D are current flow charts depicting one embodiment of a system capable of measuring a magnetic field in at least four operating phases.

Figure 1:
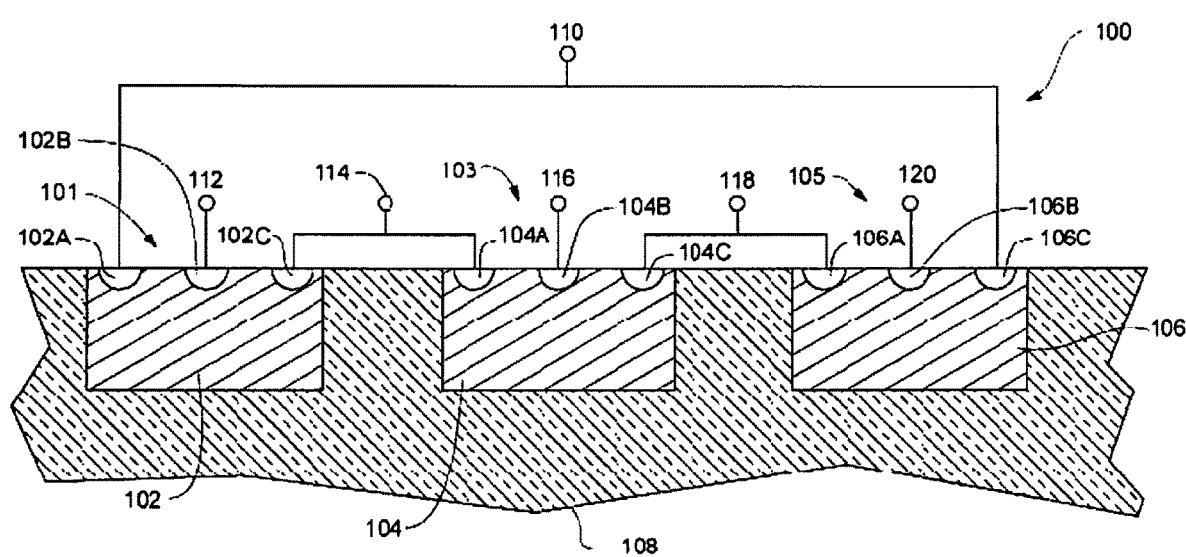
FIG. 1 is a cross-sectional illustration of three three-contact vertical Hall effect structures, according to an embodiment.

While embodiments are amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Three-contact vertical Hall effect sensors and systems are described herein that are operable in a variety of operating phases. These sensors and systems can have equal internal resistances in each operating phase in the absence of an applied magnetic field, which increases sensitivity to field strength while minimizing the required current draw to the sensors. In some embodiments, the sensors and systems have symmetry, in that they have substantially similar internal resistances and resistive heating characteristics in each of the various operating phases while spinning. Embodiments described herein include three vertical Hall effect structures arranged in a sensor ring.

Referring to FIG. 1, system 100 includes three three-contact vertical Hall effect structures 101, 103, and 105. Each Hall effect structure comprises one of Hall effect regions 102, 104, and 106 and three corresponding contacts. In particular, first Hall effect structure 101 includes Hall effect region 102 and its adjoining contacts 102A-102C; second Hall effect structure 103 includes Hall effect region 104 and its adjoining contacts 104A-104C; and third Hall effect structure 105 includes Hall effect region 106 and its adjoining contacts 106A-106C. The Hall effect regions 102, 104, and 106 each include two edge contacts (denoted with "A" and "C" at the end of the reference numeral) and one center contact (denoted with "B" at the end of the reference numeral).

The three Hall effect structures 101, 103, and 105 are disposed within die 108 along a surface 108S. In the embodiment shown in FIG. 1, each of the Hall effect regions 102, 104, and 106 are electrically isolated from one another through die 108 by a region of die 108 that is not a part of any of Hall effect regions 102, 104, or 106. In various embodiments, this region can include a decoupling portion, depletion region, or any other structure capable of electrically isolating the Hall effect regions 102, 104, and 106. As such, electrical interconnection between each of the Hall effect structures 101, 103, and 105 is accomplished by means of electrical interconnections to the contacts 102A-102C, 104A-104C, and 106A-106C.

The resistance of each of the interconnections coupled to the terminals 114, 118, and 110, respectively, is less than one tenth of the resistance between any two of the contacts of any of the Hall effect regions 102, 104, and 106. The contacts 102B, 104B, and 106B may be elongated, and may also be arranged rectilinearly. Further, at least two contacts per Hall effect region 102, 104, 106 are elongated and exactly two contacts per Hall effect region 102, 104, 106 are parallel to one another.

Electrical interconnections can be made between the contacts (102A-102C, 104A-104C, and 106A-106C) and a set of terminals in order to operate system 100 in multiple operating phases. In the embodiment shown in FIG. 1, terminal 110 is electrically connected to contacts 102A and 106C, terminal 112 is electrically connected to contact 102B, terminal 114 is connected to contacts 102C and 104A, terminal 116 is electrically connected to contact 104B, terminal 118 is electrically connected to contacts 104C and 106A, and terminal 120 is electrically connected to contact 106B.

In the embodiment shown in FIG. 1, die 108 is a substrate or other structure that supports Hall effect regions 102, 104, and 106. In various alternative embodiments, die 108 can comprise a substrate, a semiconductor die, a leadframe coupled with one or more semiconductor dies, a component board, a combination thereof or some other support structure capable of establishing and/or maintaining an accurate or relative placement of Hall effect regions 102, 104, and 106 with respect to each other and/or at least one other component. For example and simplicity, the terms "die" or "sensor die" will generally be used herein throughout but is not limiting with respect to all embodiments and/or the scope of the claims. In alternative embodiments, Hall effect regions 102, 104, and could be positioned on separate sensor dies or substrates from one another. Die 108 can be arranged in or on other structures, such as sensor packages and/or other more complex systems. The Hall effect regions 102, 104, and 106 can be close together such that the spacing between two neighbouring Hall effect regions is smaller than the Hall effect regions themselves. As such, thermal, mechanical, and magnetic field strength/direction differences are minimized. In still other embodiments, the neighboring Hall effect regions can be spaced apart from one another, for example based upon the expected target spacing of an adjacent magnetic target wheel.

System 100 is configured to sense a magnetic field. In the embodiment shown in FIG. 1, a magnetic field B is directed into the page, though this orientation can vary in other embodiments. With increasing magnetic field B, the Hall effect distorts the current streamlines through the Hall effect regions 102, 104, and 106. Without a magnetic field B, the current streamlines are symmetrical to the output contact and with the magnetic field they are shifted to one side so that they are asymmetric to the output contact. This generates a voltage excursion on the output contact. In embodiments, Hall effect regions 102, 104, and 106 and contacts 102A-102C, 104A-104C, and 106A-106C can be positioned and oriented to measure magnetic field in any desired direction, or even to measure field components in multiple directions.

Each of the Hall effect regions 102, 104, 106 may further comprise at least one highly conductive layer (not shown) that is located at a face of the Hall effect region 102, 104, 106 opposite to the face comprising the contacts 102A-102C, 104A-104C, and 106A-106C, whereby this layer is in ohmic contact to at least one Hall effect region 102, 104, 106. Also, the electrical conductivity of this layer is at least ten times larger than the conductivity of the Hall effect region 102, 104, 106.

In operation, an electrical supply is provided to operate system 100 via a subset of the terminals. The electrical supply can be, for example, a voltage or current supply. In the embodiment shown in FIG. 1, a current or voltage supply can be connected to one or more of terminals 110, 112, 114, 116, 118, and 120. A resulting output voltage at some or all of terminals 110, 112, 114, 116, 118, and 120 can be measured that corresponds to the strength of magnetic field B. The arrangement depicted in FIG. 1 permits a variety of configurations of the supply and output functions that result in operation of system 100 in different operating phases. In each such configuration, the electrical resistance of the flow paths between the supply terminals are substantially equal in the absence of a magnetic field. In this way, the problems of inconsistent internal resistances and uneven resistive heating previously discussed are addressed.

The interconnections between the various terminals and/or contacts can be accomplished in unpowered, "permanent" states, or they can be accomplished via powered switches. Permanent interconnections remain interconnected even when the device is not powered up, such as conductive lines or wiring. Permanently interconnections are low ohmic even if the device is not supplied with electrical power. In some embodiments, permanent connections can comprise wiring made of a material selected from the group consisting of aluminum, copper, and polysilicon. In embodiments, a low ohmic connection could also be an MOS-switch with sufficiently small Rds, on-resistance. But such a switch is a permanent interconnection only when the MOS transistors are depletion types (i.e., normally-on types) and not if the MOS transistors are enhancement types (i.e, normally-off types). Interconnections can be made in an interconnect layer, in some embodiments, in which permanent connections can be made via aluminum, copper, or polysilica connections, for example.

Powered switches can be used to form some interconnections, such as by MOS-switches. In one embodiment, for example, a permanent interconnection can be established between terminal 114 and contacts 102C and 104A, another permanent interconnection can be established between terminal 116 and contacts 104C and 108A, and another permanent interconnection can be established between terminal 110 and contacts 102A and 108C. In that embodiment, the remaining interconnections can be permanent, or alternatively they could be transitory, powered switches such as MOS switches.

The interconnection schemes discussed herein could be implemented on a variety of alternative Hall effect structures. For example, the Hall effect structures described in U.S. patent application Ser. Nos. 13/753,195, 13/298,917, and 13/187,935 by the same inventor and commonly assigned, describe alternative three-contact vertical Hall effect structures that could be used to implement the spinning schemes and interconnections described herein. U.S. patent application Ser. Nos. 13/753,195, 13/298,917, and 13/187,935 are hereby incorporated by reference in their entirety.

In embodiments, Hall effect regions 102, 104, and 106 can have a doping type, either n-type or p-type. For example, Hall effect regions 102, 104, and 106 could comprise n-type semiconductor having a carrier concentration of $5 \times 10^{14}$-$5 \times 10^{17}$ carriers/cm$^3$. The contacts 102A-102C, 104A-104C, and 106A-106C can be ohmic contacts. As such, they can have the same doping type as the adjacent Hall effect region (102, 104, or 106) but a much higher carrier concentration. In some embodiments, the doping concentration of each contact 102A-102C, 104A-104C, and 106A-106C is 10-1000 times higher than that of the adjacent Hall effect region 102, 104, or 106.

Figure 2:
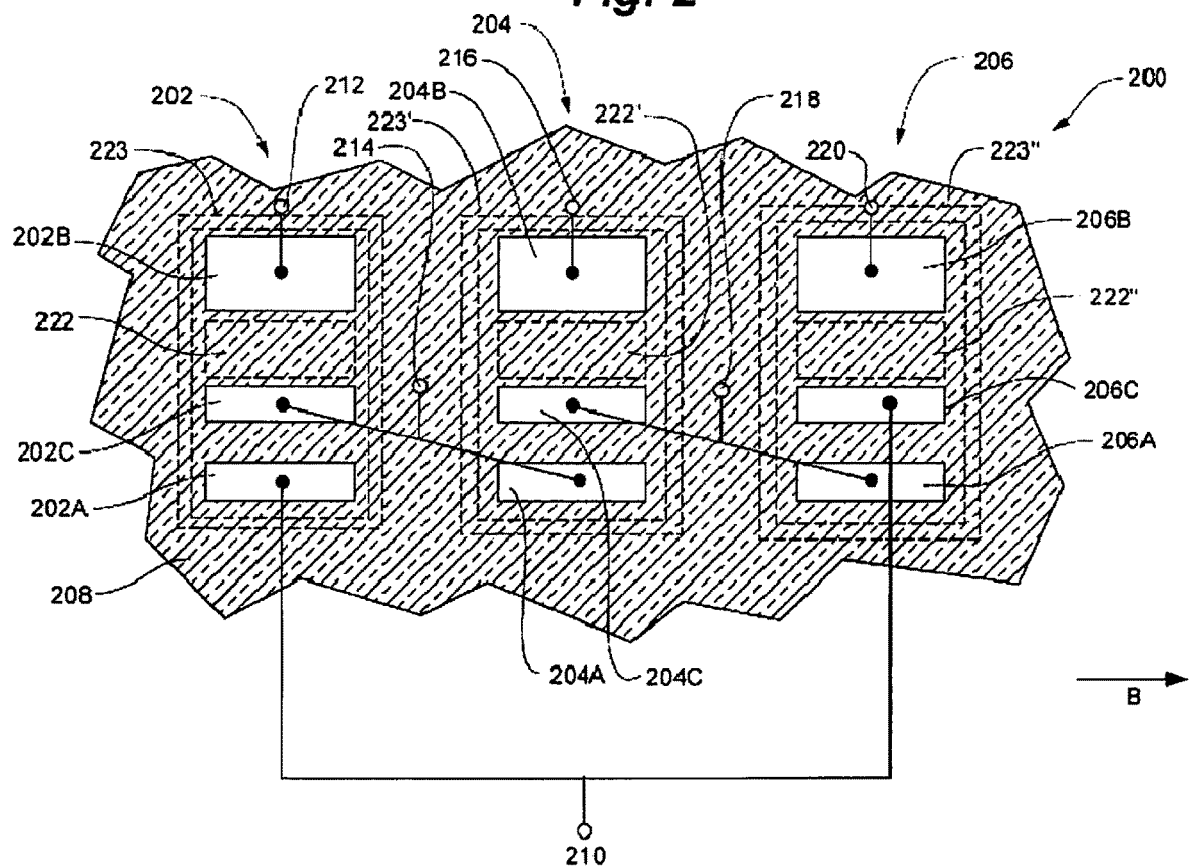
FIG. 2 is a plan view of three three-contact vertical Hall effect structures, according to another embodiment.

FIG. 2 is a plan view of system 200, according to another embodiment. The embodiment shown in FIG. 2 includes many similar features to those previously discussed with respect to FIG. 1. In those cases where the features of FIG. 2 are substantially similar in function to those previously discussed, the reference numeral associated with that feature is iterated by 100. In particular, system 200 includes Hall effect regions 202, 204, and 206. Hall effect regions 202, 204, and 206 include contacts 202A-202C, 204A-204C, and 206A-206C, respectively. Each of Hall effect regions 202, 204, and 206 are within die 208. However, Hall effect regions 202, 204, and 206 are electrically isolated from one another. The first, second, and third Hall effect regions 202, 204, and 206 can be electrically isolated, for example, by at least one of a reverse-biased pn-junction or a trench wall coated with at least one thin dielectric layer.

Terminal 210 is electrically connected to contacts 202A and 206C, terminal 212 is electrically connected to contact 202B, terminal 214 is connected to contacts 202C and 204A, terminal 216 is electrically connected to contact 204B, terminal 218 is electrically connected to contacts 204C and 206A, and terminal 220 is electrically connected to contact 206B.

The embodiment shown in FIG. 2 differs from the embodiment shown in FIG. 1 in that it includes decoupling portions 222, 222', 222", 223, 223', and 223". Decoupling portions 222, 222', and 222" and 223, 223', 223" are regions through which charge carriers do not pass. While decoupling portions 222, 222', and 222" are arranged between adjacent contacts (for example, with a buried layer beneath the decoupling portions 222, 222', and 222" that facilitates current flow therebetween), decoupling portions 223, 223', and 223" define tubs in which current flow is contained. Thus, the only current pathways between Hall effect regions 202, 204, and 206 is through the interconnections shown as wires, permanent interconnections, or terminals. Where the bulk of die 208 comprises n-type semiconductor, decoupling portions 222, 222', and 222" can be undoped or p-type semiconductor. A buried layer (not shown) can be positioned to facilitate charge carrier movement underneath decoupling portions 222, 222', and 222" that would otherwise be restricted. Decoupling portions 222, 222', and 222", and optionally buried layers, can be used to force current flowing vertical from contact 202A down to buried layer and into 202B or to tap the potential at the bottom of the Hall effect region when current flows in arcs from 202A to 202C such that the sensitivity to magnetic field B is greater, and the Hall effect on the current flow paths is magnified. The combined effect of a buried layer and a decoupling portion is to drive current around the decoupling portion (i.e., into the page with respect to the embodiment shown in FIG. 2), which magnifies the Hall effect due to the increased distance traveled by the charge carriers perpendicular to the applied magnetic field B. Furthermore, a combined buried layer and decoupling portion have the effect of restricting available current flow paths, which can reduce the required electrical supply to the sensor in order to achieve a desired sensitivity level.

The embodiment shown in FIG. 2 further differs from the embodiment shown in FIG. 1 in that Hall effect regions 202, 204, and 206 are not aligned on a plane orthogonal to magnetic field B. As previously discussed with respect to FIG. 1, various other embodiments, including those in which the Hall effect regions are angled with respect to one another within the same sensor die or arranged in different sensor dies, can be implemented depending on the application. In alternative embodiments, as described in U.S. patent application Ser. Nos. 13/753,195, 13/298,917, and 13/187,935 previously, it is possible to move at least one of the contacts (e.g., contact 202B) out of alignment with the other contacts (202A and 202B) of the same Hall effect structure. In that additional type of vertical Hall effect structure, not all three of the contacts 202A-202C are arranged in a line.

FIGS. 3A-3D are streamline plots of system 300, according to an embodiment. For ease of description, a Cartesian coordinate system, including x, y, and z axes, is used in each of FIGS. 3A-3D, and in subsequent figures, and is referenced in the description accompanying those figures. Using this convention, the magnetic field strength in the y direction is the primary quantity of interest that is being measured by system 300. The coordinate system used is for purposes of discussion only, and should not be construed as limiting in any way. It should be understood that various alternative coordinate systems or arrangements can be used to describe the same or similar systems as those described herein.

As shown in FIG. 3A, current is injected at supply terminals 316 and 320, and enters Hall effect region 304 at contact 304B and Hall effect region 306 at contact 306B. Supply terminal 312, and by extension contact 302B, is connected to ground. Output terminals 310, 314, and 318 are floating, such that the voltage at each of terminals 310, 314, and 318 depends on the current flow patterns within Hall effect regions 302, 304, and 306.

Charge carriers can flow through Hall effect regions 302, 304, and 306, and also can flow through buried layers 324, 324', and 324". The buried layers 324, 324', and 324" have significantly lower resistivity as compared to Hall effect regions 302, 304, and 306. Thus, buried layers 324, 324', and 324" promote current flow upwards and downwards with respect to the page, along the z axis in the arbitrary coordinate system shown in FIGS. 3A-3D, to and from the supply contacts (here, contacts 302B, 304B, and 306B). As will be seen with respect to alternative embodiments in which a magnetic field is applied to the system, this can result in a greater deflection of the charge carriers, and thus greater sensitivity, than systems without buried layers. In alternative embodiments, as previously described with respect to FIG. 2, a decoupling portion can be added to further promote current flow in the z direction (for example, decoupling portions could be added between adjacent contacts).

In operation, charge carriers can travel along a first flow path, in which the current flow path is predominantly first from contact 304B to contact 304A, which is electrically connected to contact 302C. The charge carriers following this first flow path then predominantly travel from contact 302C to contact 302B, which is grounded. This path will be referred to herein as the negative x direction current flow path. Alternatively, charge carriers can travel along a second flow path, in which the current flow path is predominantly first from contact 306B to contact 306C, which is electrically connected to contact 302A. The charge carriers following this second flow path then predominantly travel from contact 302A to contact 302B, which is grounded. This second current flow path will be referred to herein as the positive x direction current path. Notably, the negative x direction current path and the positive x direction current path have substantially equal current path lengths through Hall effect regions 302, 304, and 306. Thus, the voltage at output terminals 310 and 314 are substantially the same in the absence of an applied magnetic field, as are the voltages at supply terminals 316 and 320.

The systems described with reference to FIGS. 1, 2, and 3A-3D have contacts interconnected in a substantially similar pattern. In addition to providing an output voltage that can be used to ascertain sensitivity and field strength, sensor systems 100, 200, and 300 can be operated in a method known as "spinning." In the spinning process, the supply and output contacts are rearranged to operate the sensor system in different phases. Four such operating phases are shown in FIGS. 3A-3D. A corresponding, alternative operating phase can be obtained for each operating phase that is the opposite of that operating phase; that is, the current flow direction is reversed by switching the positions of supply terminals only.

In the presence of a magnetic field B in the positive y direction is applied to system 300, charge carriers moving in the negative z direction experience a Lorentz force in the positive x direction, and charge carriers moving in the positive z direction experience a Lorentz force in the negative x direction. As such, the current streamlines are deflected by an applied magnetic field. As current flow is deflected, the voltages of at least some of terminals 310, 312, 314, 316, 318, and 320 can also be affected. An opposite effect on the terminals 310, 312, 314, 316, 318, and 320 can be produced by applying magnetic field in the opposite (i.e., negative y) direction. Based on the measured voltages at each of terminals 310, 312, 314, 316, 318, and 320, the direction and/or magnitude of magnetic field B can be ascertained.

Figure 3B:
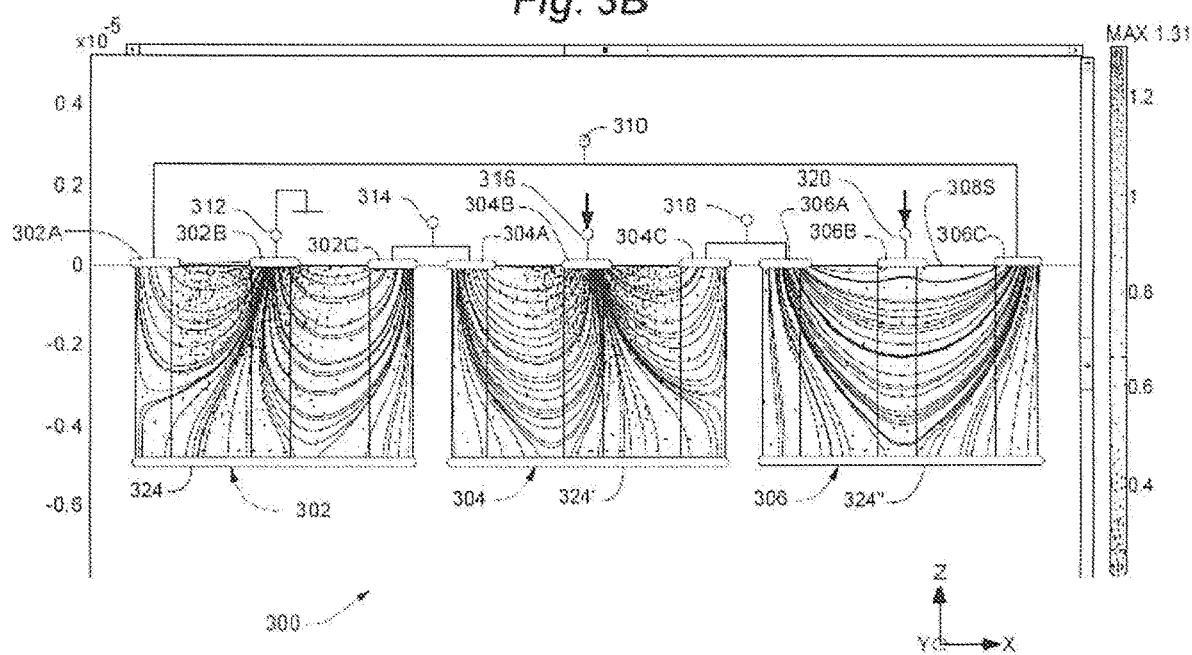

With respect to the particular embodiment shown in FIG. 3A, the supply is a 150 µA injected current applied to supply terminals 316 and 320, and each of Hall effect regions 302, 304, and 306 has a conductivity of 62.5 S/m and a Hall mobility of 0.13 1/T. In alternative embodiments these values can be different, and/or the supply terminals may be connected to a voltage supply rather than a current supply. With continued reference to the particular embodiment shown in FIG. 3A, each of Hall effect regions 302, 304, and 306 is about 7 µm by about 5 µm by about 5 µm, and the contacts 302A-302C, 304A-304C, and 306A-306C, are about 1 µm by about 5 µm. Center contacts 302B, 304B, and 306B are separated from adjacent "outer" contacts 302A, 302C, 304A, 304C, 306A, and 306C within any given Hall effect region (302, 304, 306) by about 2 µm. For ease of description, these assumptions will be used throughout the specification, with respect to additional embodiments shown in FIGS. 3B-3D and 5. It should be understood that these parameters can be modified to change the characteristics of the sensor systems described here, such as internal resistance or sensitivity, and that the values shown here are only one example.

| B [T] | 310 [V] | 312 [V] | 314 [V] | 316 [V] | 318 [V] | 320 [V] | 310-314 [V] | 316-320 [V] |
|---|---|---|---|---|---|---|---|---|
| -0.1 | 1.098013 | 0 | 1.0931193 | 1.962046 | 1.737854 | 1.96694 | 0.0048939 | -0.0048939 |
| 0 | 1.095686 | 0 | 1.0956864 | 1.964716 | 1.738059 | 1.964716 | 0 | 0 |
| 0.1 | 1.093119 | 0 | 1.0980132 | 1.96694 | 1.737854 | 1.962046 | -0.0048939 | 0.00489386 |

In the embodiment described with respect to the table above, the internal resistance of the sensor is 6549.052Ω, and from the table above we can see that the Sensitivity $S_u(310\text{-}314)$ is -0.0249088 V/V/T, and the Sensitivity $S_u(316\text{-}320)$ is 0.02490876 V/V/T.

As shown in the table above, increasing magnetic field B in the y direction results in increasing voltage at terminals 314 and 316, and decreasing voltage at terminals 310 and 320.

In alternative embodiments, modifications can be made to the resistivity, spacing, input current(s), and/or sizing of the various components of system 300. Additionally or alternatively, a voltage can be applied to terminals 316 and 320 instead of a constant current source. For example, rather than receiving a constant current, terminals 316 and 320 could be held at a constant voltage of 2 V, and the difference between the current flowing from each of terminals 316 and 320 indicates the field strength, as shown in the table below. The constant voltage could be some other value rather than 2 V, in other embodiments.

| Magnetic field B (T) | current at terminal . . . | | | |
|---|---|---|---|---|
| in the y direction | 316 | 320 | 320-316 | dI/I/B |
| -0.1 | -144.5 µA | -143.5 µA | 0.973 µA | 6.74%/T |
| 0 | -144 µA | 144 µA | 0 | |
| 0.1 | -143.5 µA | -144.5 µA | -0.973 µA | 6.74%/T |

FIG. 3B depicts sensor system 300 in a first operating phase of a second spinning scheme. Contacts 302A-302C, 304A-304C, and 306A-306C are connected to terminals 310, 312, 314, 316, 318, and 320 as previously described with respect to FIG. 3A. In contrast with the previously described supply and output arrangement, in the operating phase illustrated in FIG. 3B current is injected at supply contact 304B only. The output of this system in the presence or absence of magnetic field applied in the y direction is shown in the chart below:

| B [T] | 310 [V] | 312 [V] | 314 [V] | 316 [V] | 318 [V] | 320 [V] | 314-320 [V] |
|---|---|---|---|---|---|---|---|
| −0.1 | 0.442366 | 0 | 0.6540154 | 1.309662 | 0.870558 | 0.657278 | −0.0032626 |
| 0 | 0.440781 | 0 | 0.6549052 | 1.30981 | 0.869029 | 0.654905 | 0 |
| 0.1 | 0.439104 | 0 | 0.6556467 | 1.309662 | 0.867296 | 0.652384 | 0.0032626 |

In the embodiment described with respect to the table above, the internal resistance of the sensor is 8732.069Ω, and the sensitivity Su(314-320) is 0.0249088 V/V/T. The common mode potential of the output terminals 314 and 320 is at 50% of the voltage at the supply potential 316. The embodiment shown can be run in a reverse-polarity case as well, in which current is injected at terminal 312, while terminal 316 is connected to ground. Both supply contacts 302B and 304B are center contacts of their respective Hall effect regions, but the output terminals 314 and 320 are not center contacts, thus there is apparent asymmetry. Terminal 314 is connected to two non-central contacts, and output terminal 320 is directly connected to a single center contact. The output voltage, which is the difference between the signals at output terminals 314 and 320, changes with the supply current and applied field B.

As previously described with respect to the embodiment shown in FIG. 3A, various alterations to the size, spacing, and electrical supply source and type can be made without deviating from the scope of the invention.

A second operating phase of the second spinning scheme is illustrated in FIG. 3C. The negative x direction current flow path and the positive x direction current flow path are indicated by arrows in Hall effect regions 302, 304, and 306. A magnetic field applied in the y direction affects the voltages measured at each terminal as follows:

| B [T] | 310 [V] | 312 [V] | 314 [V] | 316 [V] | 318 [V] | 320 [V] | (316-312) [V] |
|---|---|---|---|---|---|---|---|
| −0.1 | 0.643103 | 0.322777 | 0 | 0.319514 | 0.641472 | 1.190072 | −0.00326 |
| 0 | 0.642372 | 0.321186 | 0 | 0.321186 | 0.642372 | 1.190215 | 0 |
| 0.1 | 0.641472 | 0.319514 | 0 | 0.322777 | 0.643103 | 1.190072 | 0.003263 |

From this table, we can see that the common mode potential is less than half of the supply potential (about 27%). The sensitivity Su(316-312) is about 0.027412 V/V/T in the embodiment shown, wherein the internal resistance is about 7934.769Ω.

Figure 3D:
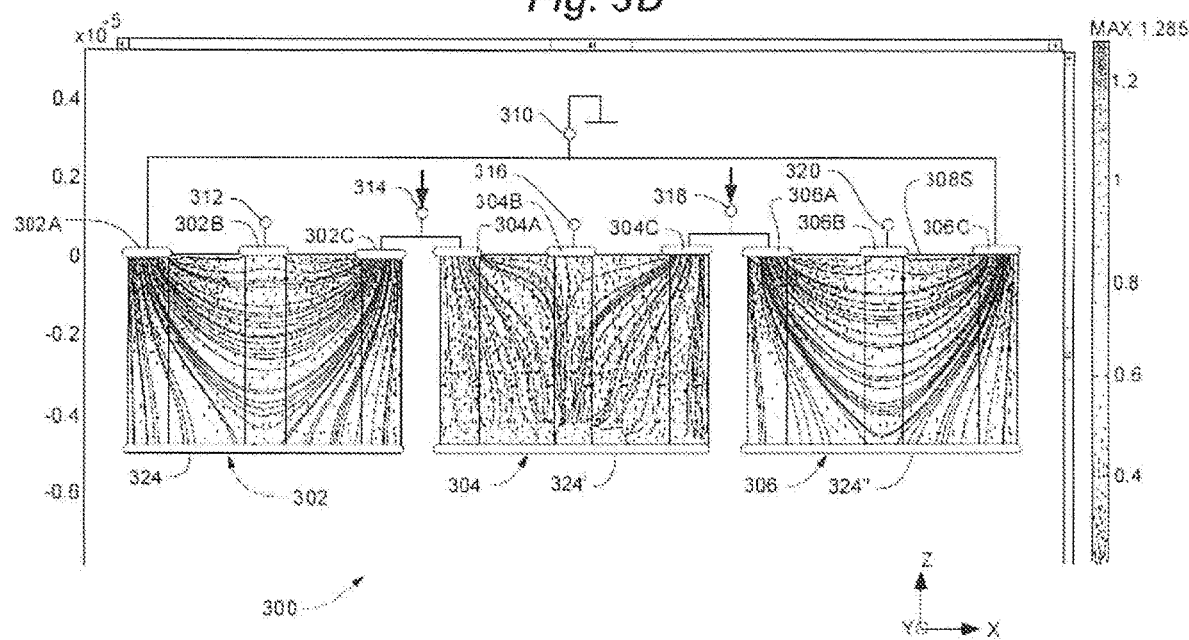

A further operating phase for system 300 is shown in FIG. 3D. In this embodiment, supply terminals 314 and 318 produce current flow paths to supply terminal 310, which is grounded. A magnetic field applied in the y direction affects the voltages measured at each terminal as follows:

| B [T] | 310 [V] | 312 [V] | 314 [V] | 316 [V] | 318 [V] | 320 [V] | 312-320 [V] |
|---|---|---|---|---|---|---|---|
| −0.1 | 0 | 0.639841 | 1.2845755 | 1.284576 | 1.284576 | 0.644735 | −0.0048939 |
| 0 | 0 | 0.642372 | 1.2847444 | 1.284744 | 1.284744 | 0.642372 | 0 |
| 0.1 | 0 | 0.644735 | 1.2845755 | 1.284576 | 1.284576 | 0.639841 | 0.00489386 |

In the embodiment described in the previous table, the internal resistance of the sensor is 4282.481Ω, and the sensitivity Su(314-318) is about 0 V/V/T while the sensitivity Su(312-320) is 0.03809211 V/V/T. Outputs between contacts having no sensitivity can be useful in some spinning circuits, as will be understood with reference to the spinning scheme described in FIGS. 7A-7C, for example.

Alternatively current could be injected into terminal 316 instead of terminals 314 and 318. If the total current into ground at terminal 310 is identical, then also the potentials at terminals 312 and 320 are identical in both cases of current injection and hence also the sensitivity of the output signal with respect to applied magnetic field is identical. A complete spinning cycle could consist of three operating phases, where current flows between terminals 316 and 310, 320 and 314, 312 and 318, respectively, while the output signals are tapped between 312 and 320, 312 and 316, 316 and 320, respectively; the set of terminals between which the current flows, and the corresponding set of terminals at which the output signal is tapped, have no terminal in common. Another complete spinning cycle could consist of six operating phases, where the polarities of currents in signals in the second three phases are opposite to the first three phases.

Figure 4:
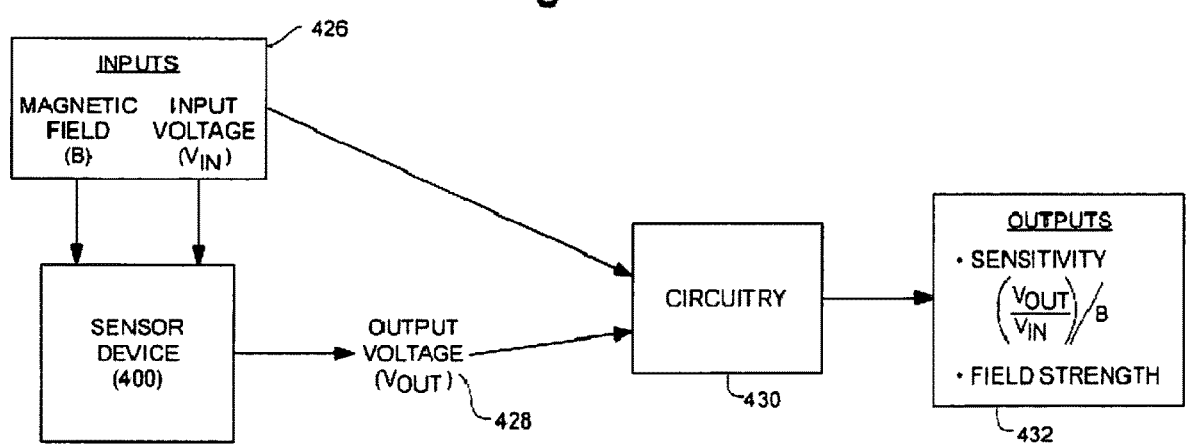
FIG. 4 is a schematic diagram illustrating circuitry configured to generate an output voltage from which sensor sensitivity and magnetic field strength can be derived, according to an embodiment.

FIG. 4 is a schematic diagram illustrating a sensor system 400 and a procedure by which that system uses inputs 426, including magnetic field B and supply voltage or current ($V_{in}$, $L_{in}$), to generate an output voltage 428. FIG. 4 further illustrates circuitry 430 configured to receive inputs 426 and output voltage 428 and to generate outputs 432. Outputs 432 can include a sensitivity and a field strength output.

As previously described with reference to FIGS. 3A-3D, the voltage at terminals 310, 314, 316, and 320 of system 300 depend upon the strength of magnetic field B and supply voltage or current ($V_{in}$, $I_{in}$). Similarly, sensor system 400 receives field and supply inputs 426 to generate an output voltage 428.

Circuitry 430 can be, for example, an analog or digital circuit or processor. Circuitry 430 receives data associated with inputs 426 and output voltage 428. Circuitry 430 can generate data therefrom, including sensitivity and field strength data.

Figure 5:
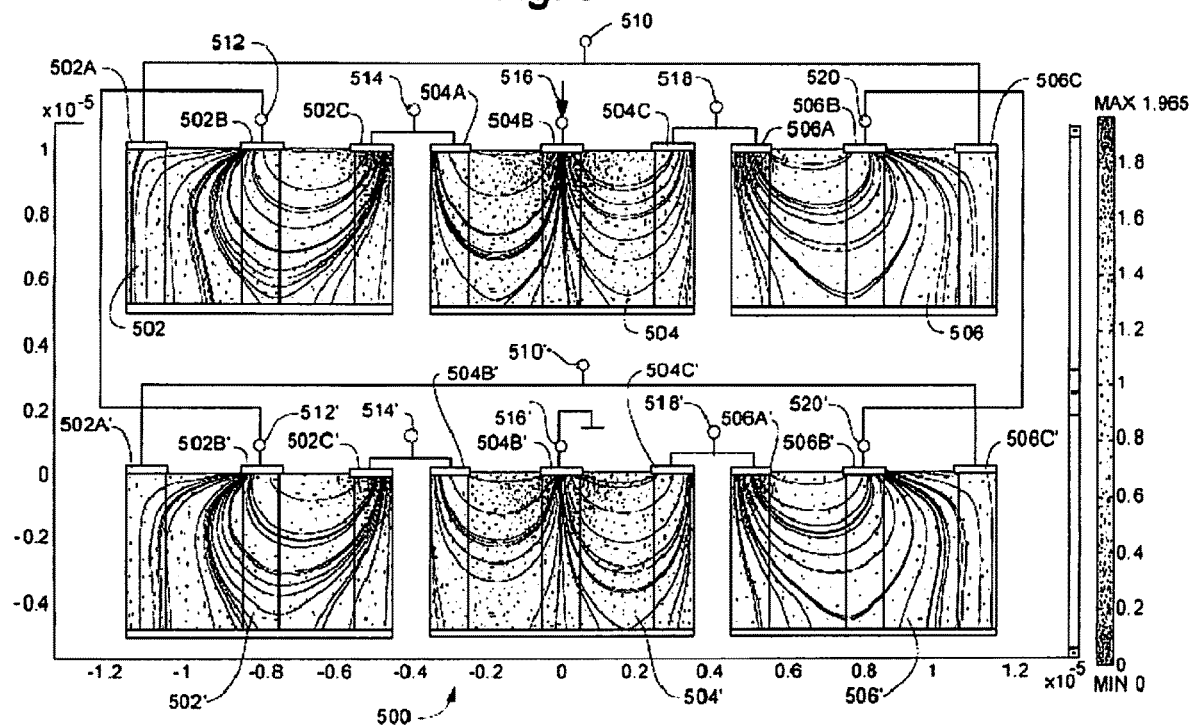
FIG. 5 is a current flow chart depicting a system comprising two sensor sub-systems each having three three-contact vertical Hall effect structures.

Various additional permutations of operating phases can be constructed by combining sensor sub-systems into more complex sensor systems. For example, FIG. 5 is a current flow chart depicting two sensor sub-systems, 500 and 500', coupled together by shared electrical interconnections. Sensor sub-system 500 includes sensor elements 502, 504, and 506, and sensor sub-system 500' includes sensor elements 502', 504', and 506'. Electrical current flows from supply terminal 516, which is coupled to contact 504B.

Current can flow along a first current flow path through Hall effect region 504 to contact 504C. Contact 504C is coupled to contact 506A (and terminal 516). From contact 506A, current can flow through Hall effect region 506 to contact 506B. Contact 506B is coupled to contact 506B' (and terminals 520 and 520'). Current can then flow from contact 506B' through Hall effect region 506' to contact 506A'. Contact 506A' is coupled to contact 504C' (and terminal 518'). Current can flow from contact 504C' through Hall effect region 504' to contact 504B'. Contact 504B' is coupled to supply terminal 516, which is grounded.

Alternatively, current can flow along a second current flow path through Hall effect region 504 to contact 504A. Contact 504A is coupled to contact 502C (and terminal 514). From contact 502C, current can flow through Hall effect region 502 to contact 502B. Contact 502B is coupled to contact 502B' (and terminals 512 and 512'). Current can then flow from contact 502B' through Hall effect region 502' to contact 502C'. Contact 502C' is coupled to contact 504A' (and terminal 514'). Current can flow from contact 504A' through Hall effect region 504' to contact 504B'. Contact 504B' is coupled to supply terminal 516, which is grounded.

The portion of the current that flows along each of the aforementioned paths depends upon the strength and direction of an applied magnetic field. For the embodiment shown above, the following voltages can be measured when a current of 150 µA is used to operate the circuit:

640. Cable 636 could be leads, wires, or other structures for carrying measured or tapped signal from the sensor sub-systems 600 and 600'.

Sensor sub-systems 600 and 600' are configured to sense the magnitude of magnetic field B, and spinning can be used to measure the field strength redundantly to address inconsistent internal resistances between contacts of sensor sub-systems 600 and 600'. In the embodiment shown in FIG. 6, sensor sub-systems 600 and 600' include interconnections substantially the same as those previously described with respect to their counterparts, sensor sub-systems 500 and 500', as shown in FIG. 5. In alternative embodiments, housing 634 can contain one, two, or many sensor sub-systems, which can be arranged on separate sensor dies or, in some embodiments, several sensor sub-systems may be positioned on a common sensor die.

In some embodiments, connections 640 can be direct connections, and spinning can be accomplished by changing input/outputs 638 remotely. In further embodiments, spinning can be accomplished by rearranging connections 640 at circuitry (not shown) positioned within housing 634. Such spinnable connections allow for the measurement of the field strength of magnetic field B in multiple operating phases without reconfiguring the connections between the terminals and the contacts of sensor sub-systems 600 and 600'.

Figure 7A:
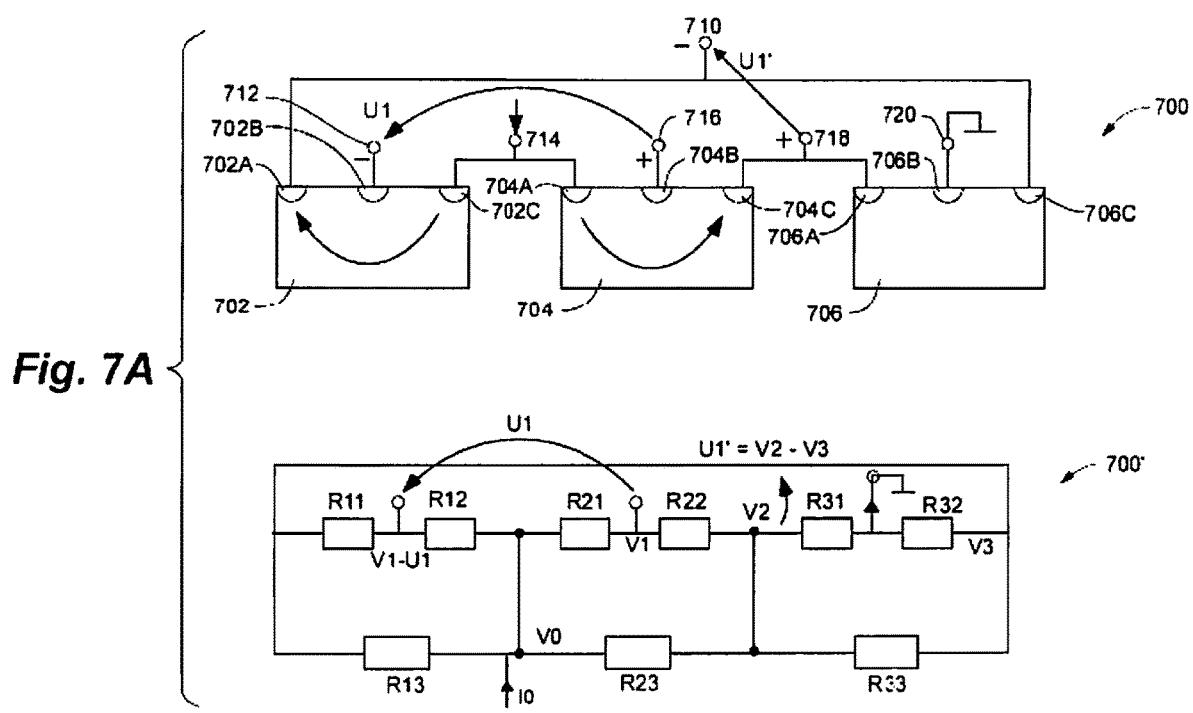
FIGS. 7A-7C are equivalent circuit diagrams depicting a spinning scheme having three operating phases.
Figure 7B:
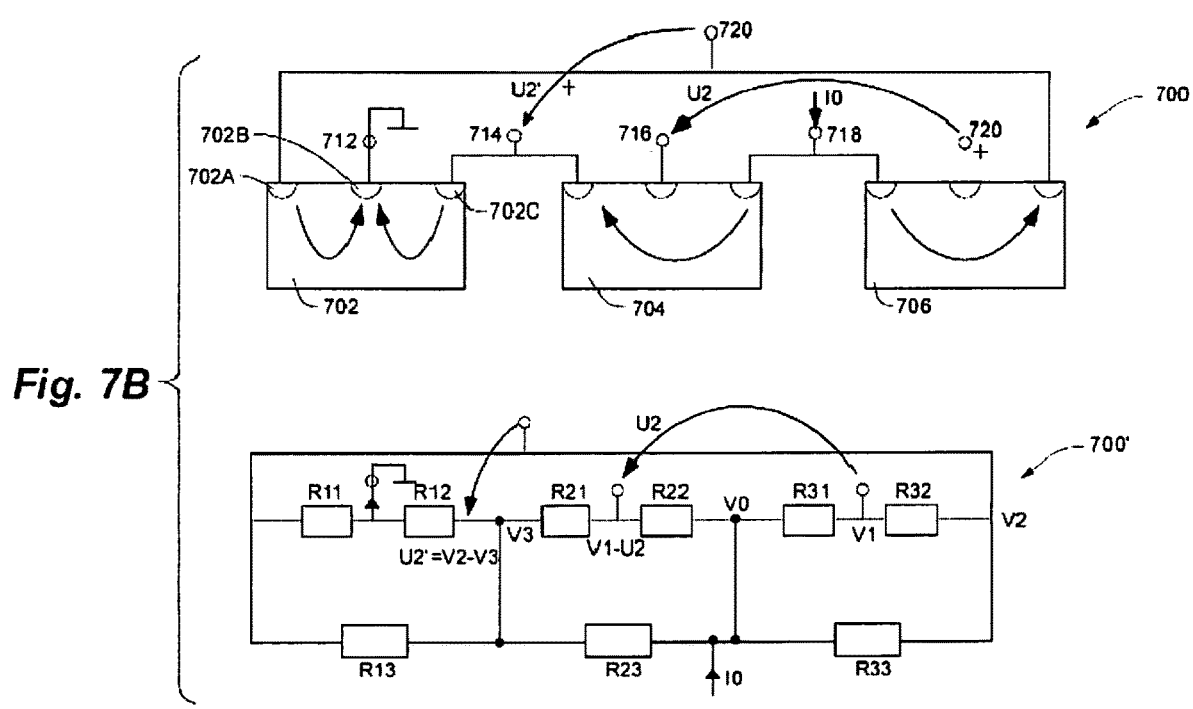
Figure 7C:
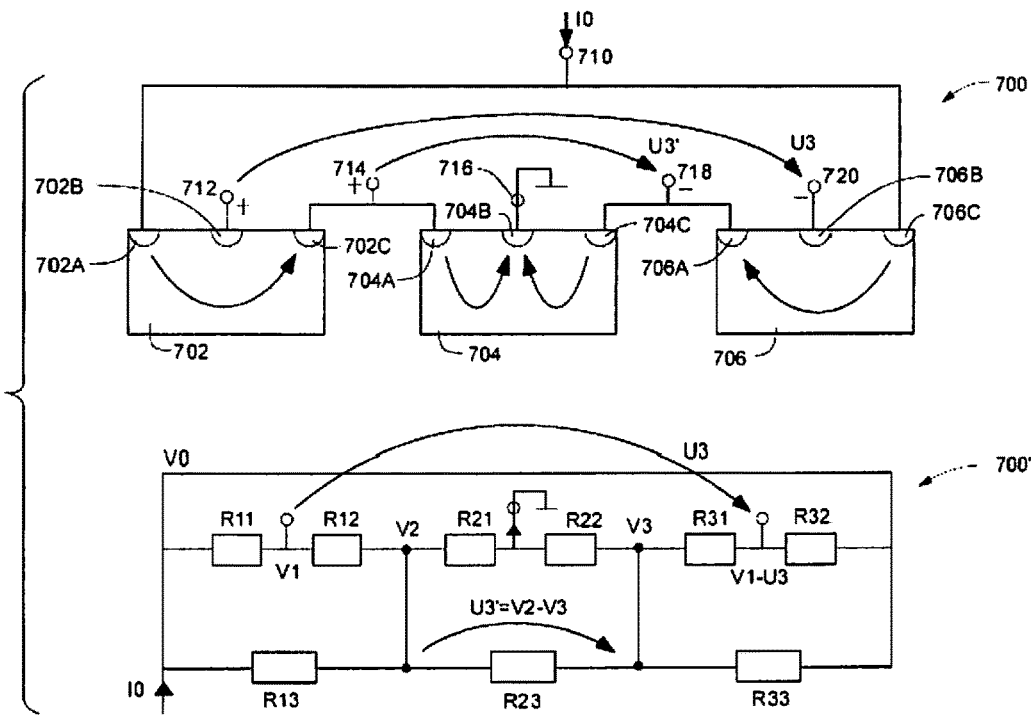

FIGS. 7A-7C each depict a sensor device 700, as well as an equivalent circuit diagram 700', for each of three operating phases, respectively, of a spinning scheme. In each equivalent circuit diagram, resistors R11, R12, R13, R21, R22, R23, R31, R32, and R33 are arranged as a proxy for the Hall effect regions of the sensor device 700. In particular, resistors R11, R12, and R13 simulate Hall effect region 702; resistors R21, R22, and R23 simulate Hall effect region 704; resistors R31, R32, and R33 simulate Hall effect region 706. Interconnections are also shown in accordance with the interconnection schemes illustrated in earlier-described embodiments. Although the equivalent circuit diagrams 700' correspond to the particular sensor device 700 shown, it should be understood that equivalent circuit diagrams can be

| B[T] | 510 [V] | 512/512' [V] | 514 [V] | 516 [V] | 518 [V] | 520/520' [V] | 510' [V] | 514' [V] | 516' [V] | 518' [V] |
|---|---|---|---|---|---|---|---|---|---|---|
| −0.01 | 0.868933 | 0.982251 | 0.548608 | 0 | 0.546961 | 0.982251 | 1.0955693 | 1.415894 | 1.964502 | 1.417541 |
| 0 | 0.869029 | 0.982358 | 0.547843 | 0 | 0.547843 | 0.982358 | 1.0956864 | 1.416872 | 1.964716 | 1.416872 |
| 0.1 | 0.868933 | 0.982251 | 0.546961 | 0 | 0.548608 | 0.982251 | 1.0955693 | 1.417541 | 1.964502 | 1.415894 |
| Sensitivity [V/T] | 0 | 0 | −0.00823 | 0 | 0.00823 | 0 | 0 | 0.00823 | 0 | −0.00823 |
| Su [V/V/T] | 0 | 0 | −0.00419 | 0 | 0.00419 | 0 | 0 | 0.00419 | 0 | −0.00419 |

The voltage at terminals 514' and 518', and/or between terminals 514 and 518, can be measured to provide the output voltage (with a magnetic field sensitivity of 0.00838 1/T).

The operating phases of each of the sensor sub-systems 500 and 500' can be changed between those previously described with respect to FIGS. 3A-3D, or others. By spinning between these operating phases, offset errors and inconsistent thermal heating within the Hall effect regions 502, 504, 506, 502', 504', and 506' are reduced or eliminated.

Figure 6:
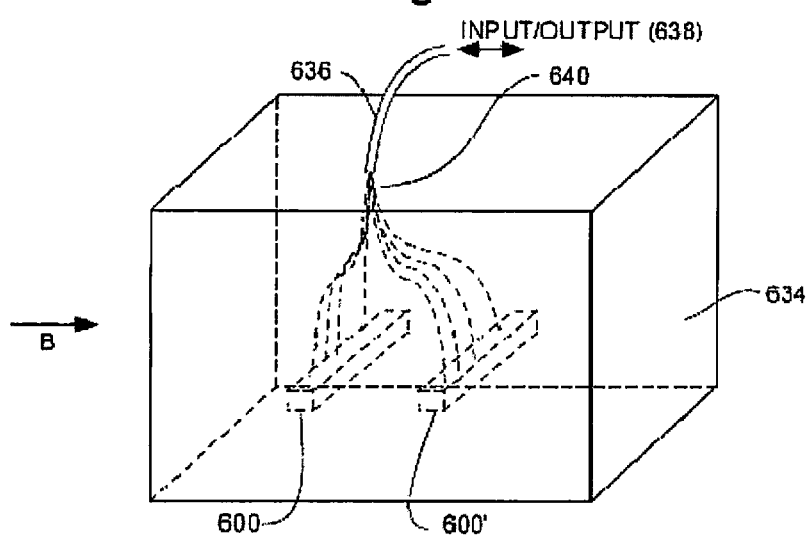
FIG. 6 is a perspective view of a sensor package including two sensor sub-systems.

FIG. 6 is a perspective view of sensor sub-systems 600 and 600' (shown in phantom) arranged within a package or housing 634. Wiring or cable 636 is connected to housing 634 to transmit inputs/outputs 638 from sensor sub-systems 600 and 600' to a remote device, such as a processor, a bridge circuit, or other circuitry. Cable 636 is further connected to sensor sub-systems 600 and 600' via connections constructed for any other embodiment, such as the sensor systems 100, 200, and 300 of previously described figures. In those alternative embodiments, the values of the various resistances, currents, and voltages shown may vary from those of equivalent circuit diagram 700'.

In each of the three operating phases shown in FIGS. 7A, 7B, and 7C, respectively, two voltage outputs can be measured, shown as U1 and U1' in the first operating phase in FIG. 7A, U2 and U2' in the second operating phase shown in FIG. 7B, and U3 and U3' in the third operating phase shown in FIG. 7C. Thus, by spinning the input and output contacts through these three operating phases, six output voltage signals are obtained. In the first operating phase, depicted in FIG. 7A, current is injected at terminal 714 (resulting in voltage V0), and terminal 720 is connected to ground. Voltages U1 and U2 are measured between terminals 716 and 712, and terminals 718 and 720, respectively.

In FIGS. 7B and 7C, output voltages U2, U2', U3, and U3' are measured in a similar fashion Some of the output voltages are positive and some are negative in the absence of a magnetic field, depending on the values of the resistors R11, R12, . . . R33. These are the offset errors of the Hall effect devices. Yet, the sum over all offset errors vanishes, i.e. in the absence of a magnetic field, $$U1+U1'+U2+U2'+U3+U3'=0.$$

The "+" and "−" indicators in the Figures indicate whether the potential at each terminal will rise or fall, respectively, in the presence of a magnetic field having a component in the direction to which the sensor 700 is sensitive (e.g., the y direction shown with respect to FIGS. 1-3). The sum of these outputs in the absence of a magnetic field component in the sensitive direction will be zero no matter whether the internal resistances (R11, R12, . . . R33) representative of the offset errors of the Hall effect devices are the same or different from one another. However, as the outputs change as a function of the magnetic field, the part of the output voltage that is due to magnetic field-induced (i.e., the Hall voltage) will be added constructively, while differences due to other offsets (such as those related to thermal or mechanical stresses) will combine destructively. In this way, the sensitivity of the overall system is increased by spinning, while errors due to mechanical and thermal stresses are reduced or eliminated.

The spinning scheme shown in FIG. 7 is only one of a variety of possible spinning schemes. That is, there are many more terminals that can be used to route current through the system, and tap output voltages. Notably, in many cases the output voltages can be tapped from an edge contact (previously described with respect to FIG. 1) or from a terminal connected to two contacts of different Hall effect regions, while current is provided at a center contact (previously described with respect to FIG. 1) or from a terminal that is merely connected to a single contact in a single Hall effect region, or vice versa. The spinning cycle needs only three phases instead of the more conventional 4-phase spinning systems. The impedance of the device is identical in all three phases and an identical common-mode potential for the output voltages can be used. The current is split in two equal parts through the ring, which is highly symmetric and gives identical self-heating, thereby reducing overall offset error.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A vertical Hall effect senor comprising:
   Hall effect regions comprising a first Hall effect region, a second Hall effect region, a third Hall effect region, a fourth vertical Hall effect region, a fifth vertical Hall effect region, and a sixth vertical Hall effect region, wherein the first, second, and third Hall effect regions are electrically isolated from each other;
   the first Hall effect region comprising first, second, and third contacts arranged in a straight line along a surface of a die, wherein one of the first, second, and third contacts is a first center contact arranged between the other two of the first, second, and third contacts;
   the second Hall effect region comprising fourth, fifth, and sixth contacts arranged in a straight line along the surface of the die, wherein one of the fourth, fifth, and sixth contacts is a second center contact arranged between the other two of the fourth, fifth, and sixth contacts;
   the third Hall effect region comprising seventh, eighth, and ninth contacts arranged in a straight line along the surface of the die, wherein one of the seventh, eighth, and ninth contacts is a third center contact arranged between the other two of the seventh, eighth, and ninth contacts;
   the fourth vertical Hall effect region comprising tenth, eleventh, and twelfth contacts arranged along the surface of the die;
   the fifth vertical Hall effect region comprising thirteenth, fourteenth, and fifteenth contacts arranged along the surface of the die;
   the sixth vertical Hall effect region comprising sixteenth, seventeenth, and eighteenth contacts arranged along the surface of the die; and
   circuitry external to the Hall effect regions, the circuitry comprising:
      a first terminal connected to one of the first, second, and third contacts of the first Hall effect region;
      a first interconnection only connected between an other one of the first, second, and third contacts of the first Hall effect region and one of the fourth, fifth, and sixth contacts of the second Hall effect region, wherein the first interconnection is not connected to the first center contact or the second center contact;

a second terminal connected to an other one of the fourth, fifth, and sixth contacts of the second Hall effect region;

a second interconnection connected between yet an other one of the fourth, fifth, and sixth contacts of the second Hall effect region and one of the seventh, eighth, and ninth contacts of the third Hall effect region, wherein the second interconnection is not connected to the second center contact or the third center contact;

a third terminal connected to an other one of the seventh, eighth, and ninth contacts of the third Hall effect region; and a third interconnection connected directly between yet an other one of the first, second, and third contacts of the first Hall effect region and yet an other of the seventh, eighth, and ninth contacts of the third Hall effect region, wherein the third interconnection is not connected to the first center contact or the third center contact, wherein:
the first terminal is permanently connected to the twelfth contact;
the third terminal is permanently connected to the eighteenth contact;
a fourth interconnection is permanently connected to the eleventh and thirteenth contacts;
a fourth terminal is permanently connected to the fifteenth contact;
a fifth interconnection is permanently connected to the fourteenth and sixteenth contacts; and
a sixth interconnection is permanently connected to the tenth and seventeenth contacts.

2. The vertical Hall effect senior of claim 1, wherein the first interconnection is electrically isolated from the third Hall effect region.

3. The vertical Hall effect sensor of claim 1, wherein:
the first interconnection comprises a fourth terminal,
the second interconnection comprises a fifth terminal; and
the third interconnection comprises a sixth terminal.

4. The vertical Hall effect sensor of claim 1, wherein the first, second, and third interconnections comprise permanent interconnections.

5. The vertical Hall effect sensor of claim 1, wherein the resistance of each of the first, second, and third interconnections is less than one tenth of the resistance between any two of the contacts of any of the first, second, and third Hall effect regions.

6. The vertical Hall effect sensor of claim 1, wherein at least the third, sixth, and ninth contacts, of the first, second, and third Hall effect regions, respectively, are elongated.

7. The vertical Hall effect sensor of claim 1, wherein the first, second, and third terminals are connected to the third, sixth, and ninth contacts, respectively, and at least the third, sixth, and ninth contacts are parallel to one another, such that each Hall effect region of the vertical Hall effect sensor is configured to respond to a same magnetic field component.

8. The vertical Hall effect sensor of claim 1, wherein:
the first, second, and third Hall effect regions each comprise n-type semiconductor material having a carrier concentration between $5 \times 10^{14}$–$5 \times 10^7$ carriers per cubic centimeter, and each of the contacts comprises an n-type semiconductor material having a carrier concentration that is at least ten times larger than the carrier concentration of the Hall effect regions.

9. The vertical Hall effect sensor of claim 1, wherein the first, second, and third terminals are connected to the third, sixth, and ninth contacts, respectively, and the third, sixth, and ninth contacts are arranged rectilinearly.

10. The vertical Hall effect sensor of claim 1, wherein the first, second, and third Hall effect regions are electrically isolated from one another by at least one of a reverse-biased pn-junction or a trench wall coated with at least one thin dielectric layer.

11. The vertical Hall effect sensor of claim 1, wherein at least two contacts per Hall effect region are elongated and two contacts per Hall effect region are parallel to one another.

12. The vertical Hall effect sensor of claim 1, wherein each of the first, second, and third Hall effect regions further comprises at least one highly conductive layer that is located at a face of the Hall effect region opposite to the face comprising the contacts, whereby this layer is in ohmic contact to at least one Hall effect region; and whereby the electrical conductivity of this layer is at least ten times larger than the conductivity of the Hall effect region.

13. The vertical Hall effect structure of claim 1, wherein each of the first, second, and third Hall effect regions comprises a separate highly conductive layer.

14. The vertical Hall effect sensor of claim 1, wherein the Hall effect regions are connected in series to form a complete ring.

15. The vertical Hall effect sensor of claim 1,
wherein the first interconnection only connected directly between the other one of the first, second, and third contacts of the first Hall effect region and the one of the fourth, fifth, and sixth contacts of the second Hall effect region, and
wherein the second interconnection connected directly between yet the other one of the fourth, fifth, and sixth contacts of the second Hall effect region and the one of the seventh, eighth, and ninth contacts of the third Hall effect region.

16. A method of providing a vertical Hall effect sensor, the method comprising:
providing Hall effect regions comprising a first Hall effect region, a second Hall effect region, a third Hall effect region, a fourth vertical Hall effect region, a fifth vertical Hall effect region, and a sixth vertical Hall effect region, wherein the first, second, and third Hall effect regions are electrically isolated from each other,
the first Hall effect region having first, second, and third contacts arranged in a straight line along a surface of a die wherein one of the first, second, and third contacts is a first center contact arranged between the other two of the first, second, and third contacts,
the second Hall effect region having fourth, fifth, and sixth contacts arranged in a straight line along the surface of the die, wherein one of the fourth, fifth, and sixth contacts is a second center contact arranged between the other two of the fourth, fifth, and sixth contacts,
the third Hall effect region having seventh, eighth, and ninth contacts arranged in a straight line along the surface of the die, wherein one of the seventh, eighth, and ninth contacts is a third center contact arranged between the other two of the seventh, eighth, and ninth contacts, the fourth vertical Hall effect region comprising tenth, eleventh, and twelfth contacts arranged along the surface of the die, the fifth vertical Hall effect region comprising thirteenth, fourteenth, and fifteenth contacts arranged along the surface of the die, and the sixth vertical Hall effect region comprising sixteenth, seventeenth, and eighteenth contacts arranged along the surface of the die; and interconnecting the first, second, and third Hall effect regions such that:

a first terminal is permanently connected to one of the first, second, and third contacts of the first Hall effect region;

an other one of the first, second, and third contacts of the first Hall effect region and one of the fourth, fifth, and sixth contacts of the second Hall effect region are only connected by a first interconnection, wherein the first interconnection is not connected to the first center contact or the second center contact;

a second terminal is permanently connected to an other one of the fourth fifth, and sixth contacts of the second Hall effect region;

yet an other one of the fourth fifth, and sixth contacts of the second Hall effect region and one of the seventh, eighth, and ninth contacts of the third Hall effect region are permanently connected by a second interconnection, wherein the second interconnection is not connected to the second center contact or the third center contact;

a third terminal is permanently connected to an other one of the seventh, eighth, and ninth contacts of the third Hall effect region;

yet an other one of the first second, and third contacts of the first Hall effect region and yet an other one of the seventh, eighth, and ninth contacts of the third Hall effect region are permanently connected directly by a third interconnection, wherein the third interconnection is not connected to the first center contact or the third center contact;

the first terminal is permanently connected to the twelfth contact;

the third terminal is permanently connected to the eighteenth contact;

a fourth interconnection is permanently connected to the eleventh and thirteenth contacts;

a fourth terminal is permanently connected to the fifteenth contact;

a fifth interconnection is permanently connected to the fourteenth and sixteenth contacts; and a sixth interconnection is permanently connected to the tenth and seventeenth contacts.

17. The method of claim 16, wherein the first interconnection is electrically isolated from the third Hall effect region.

18. The method of claim 16, wherein:
a fourth terminal is connected to the first interconnection,
a fifth terminal is connected to the second interconnection; and
a sixth terminal is connected to the third interconnection.

19. The method of claim 16, further comprising:
supplying the vertical Hall effect sensor with electrical energy at a first set of the first, second, and third terminals;
tapping a signal at a second set of the first, second, and third terminals.

20. The method of claim 19, wherein the first set of terminals and the second set of terminals have no terminal in common.

21. The method of claim 19, wherein:
one of the first set of terminals is chosen from the group consisting of the fourth, fifth, and sixth terminals; and
an other of the first set of terminals is chosen from the group consisting of the first, second, and third terminals.

22. The method of claim 19, wherein:
one of the second set of terminals is chosen from the group consisting of the fourth, fifth, and sixth terminals; and
an other of the second set of terminals is chosen from the group consisting of the first, second, and third terminals.

23. The method of claim 16, wherein the Hall effect regions are connected in series to form a complete ring.

24. The method of claim 16,
wherein the first interconnection only connected directly between the other one of the first, second, and third contacts of the first Hall effect region and the one of the fourth, fifth, and sixth contacts of the second Hall effect region, and
wherein the second interconnection connected directly between yet the other one of the fourth, fifth, and sixth contacts of the second Hall effect region and the one of the seventh, eighth, and ninth contacts of the third Hall effect region.

25. A vertical Hall effect senor comprising:
a first Hall effect region comprising first, second, and third contacts arranged in a straight line along a surface of a die, wherein one of the first, second, and third contacts is a first center contact arranged between the other two of the first, second, and third contacts;
a second Hall effect region comprising fourth, fifth, and sixth contacts arranged in a straight line along the surface of the die, wherein one of the fourth, fifth, and sixth contacts is a second center contact arranged between the other two of the fourth, fifth, and sixth contacts;
a third Hall effect region comprising seventh, eighth, and ninth contacts arranged in a straight line along the surface of the die, wherein one of the seventh, eighth, and ninth contacts is a third center contact arranged between the other two of the seventh, eighth, and ninth contacts;
a fourth vertical Hall effect region comprising tenth, eleventh, and twelfth contacts arranged along the surface of the die;
a fifth vertical Hall effect region comprising thirteenth, fourteenth, and fifteenth contacts arranged along the surface of the die;
a sixth vertical Hall effect region comprising sixteenth, seventeenth, and eighteenth contacts arranged along the surface of the die; and
circuitry external to the Hall effect regions, the circuitry comprising:
a first terminal connected to one of the first, second, and third contacts of the first Hall effect region;
a first interconnection only connected between an other one of the first, second, and third contacts of the first Hall effect region and one of the fourth, fifth, and sixth contacts of the second Hall effect region, wherein the first interconnection is not connected to the first center contact or the second center contact;

a second terminal connected to an other one of the fourth, fifth, and sixth contacts of the second Hall effect region;

a second interconnection connected between yet an other one of the fourth, fifth, and sixth contacts of the second Hall effect region and one of the seventh, eighth, and ninth contacts of the third Hall effect region, wherein the second interconnection is not connected to the second center contact or the third center contact;

a third terminal connected to an other one of the seventh, eighth, and ninth contacts of the third Hall effect region; and a third interconnection connected between yet an other one of the first, second, and third contacts of the first Hall effect region and yet an other of the seventh, eighth, and ninth contacts of the third Hall effect region, wherein the third interconnection is not connected to the first center contact or the third center contact, wherein:
the first, second, and third Hall effect regions are electrically isolated against each other,
the first terminal is permanently connected to the twelfth contact,
the third terminal is permanently connected to the eighteenth contact,
a fourth interconnection is permanently connected to the eleventh and thirteenth contacts,
a fourth terminal is permanently connected to the fifteenth contact,
a fifth interconnection is permanently connected to the fourteenth and sixteenth contacts, and
a sixth interconnection is permanently connected to the tenth and seventeenth contacts.

26. A method of providing a vertical Hall effect sensor, the method comprising:

providing a first Hall effect region having first, second, and third contacts arranged in a straight line along a surface of a die, wherein one of the first, second, and third contacts is a first center contact arranged between the other two of the first, second, and third contacts;

providing a second Hall effect region having fourth, fifth, and sixth contacts arranged in a straight line along the surface of the die, wherein one of the fourth, fifth, and sixth contacts is a second center contact arranged between the other two of the fourth, fifth, and sixth contacts;

providing a third Hall effect region having seventh, eighth, and ninth contacts arranged in a straight line along the surface of the die, wherein one of the seventh, eighth, and ninth contacts is a third center contact arranged between the other two of the seventh, eighth, and ninth contacts;

providing a fourth vertical Hall effect region comprising tenth, eleventh, and twelfth contacts arranged along the surface of the die;

providing a fifth vertical Hall effect region comprising thirteenth, fourteenth, and fifteenth contacts arranged along the surface of the die;

providing a sixth vertical Hall effect region comprising sixteenth, seventeenth, and eighteenth contacts arranged along the surface of the die;

providing electrical isolation between the first, second, and third Hall effect regions; and interconnecting the first, second, and third Hall effect regions such that:
a first terminal is permanently connected to one of the first, second, and third contacts of the first Hall effect region;
an other one of the first, second, and third contacts of the first Hall effect region and one of the fourth, fifth, and sixth contacts of the second Hall effect region are only connected by a first interconnection, wherein the first interconnection is not connected to the first center contact or the second center contact;
a second terminal is permanently connected to an other one of the fourth fifth, and sixth contacts of the second Hall effect region;
yet an other one of the fourth fifth, and sixth contacts of the second Hall effect region and one of the seventh, eighth, and ninth contacts of the third Hall effect region are permanently connected by a second interconnection, wherein the second interconnection is not connected to the second center contact or the third center contact;
a third terminal is permanently connected to an other one of the seventh, eighth, and ninth contacts of the third Hall effect region;
yet an other one of the first second, and third contacts of the first Hall effect region and yet an other one of the seventh, eighth, and ninth contacts of the third Hall effect region are permanently connected by a third interconnection, wherein the third interconnection is not connected to the first center contact or the third center contact;
the first terminal is permanently connected to the twelfth contact;
the third terminal is permanently connected to the eighteenth contact;
a fourth interconnection is permanently connected to the eleventh and thirteenth contacts;
a fourth terminal is permanently connected to the fifteenth contact;
a fifth interconnection is permanently connected to the fourteenth and sixteenth contacts; and
a sixth interconnection is permanently connected to the tenth and seventeenth contacts.

* * * * *